United States Patent
Lahrichi

(12) 
(10) Patent No.: US 6,686,097 B2
(45) Date of Patent: *Feb. 3, 2004

(54) REVERSIBLE HOLOGRAM FIXATION IN PHOTOREFRACTIVE MATERIALS USING INCOHERENT ULTRAVIOLET LIGHT

(76) Inventor: Adil Lahrichi, 2810 Marine St., Suite B, Boulder, CO (US) 80303

(*) Notice: Subject to any disclaimer, the term of this patent is extended or adjusted under 35 U.S.C. 154(b) by 0 days.

This patent is subject to a terminal disclaimer.

(21) Appl. No.: 10/243,142

(22) Filed: Sep. 13, 2002

(65) Prior Publication Data

US 2003/0073007 A1 Apr. 17, 2003

Related U.S. Application Data

(63) Continuation of application No. 09/323,870, filed on Jun. 1, 1999, now Pat. No. 6,468,699.

(51) Int. Cl.$^7$ .................................................. G03H 1/02
(52) U.S. Cl. ........................ 430/1; 430/2; 359/3; 359/7
(58) Field of Search .............................. 430/1, 2; 359/1, 359/3, 7

(56) References Cited

U.S. PATENT DOCUMENTS

| | | | | |
|---|---|---|---|---|
| 3,773,400 A | * | 11/1973 | Amodei et al. .............. 350/3.5 |
| 4,095,331 A | * | 6/1978 | Rutz .............................. 357/4 |
| 5,002,975 A | * | 3/1991 | Bartoszek-Loza et al. .... 522/14 |
| 5,648,856 A | * | 7/1997 | Stoll .............................. 359/7 |
| 6,468,699 B2 | * | 10/2002 | Lahrichi ........................ 430/1 |

OTHER PUBLICATIONS

Guenther, et al., Intensity Dependence and White Light Gating of Two Color . . . Opt. Lett., vol. 22(17) pp. 1305–1307.*

* cited by examiner

Primary Examiner—Martin Angebranndt

(57) ABSTRACT

A holographic information storage and retrieval system provides an all-optical reversible method to fix information in doped or undoped photorefractive materials. The fixed information is sufficiently stable to provide long term archival storage over a period of decades or more and can be read out non-destructively by a coherent reference beam. Holograms recorded in a photorefractive material are fixed when the material is irradiated with incoherent ultraviolet light. Hence, the holograms are preserved indefinitely against erasure by a coherent beam and against dissipation in dark storage. Holograms, which are fixed in the photorefractive material with incoherent ultraviolet light, are also erased with incoherent ultraviolet light, thus making the process reversible.

13 Claims, 15 Drawing Sheets

REVERSIBLE HOLOGRAM FIXATION IN PHOTOREFRACTIVE MATERIALS USING INCOHERENT ULTRAVIOLET LIGHT

This application is a continuation of application Ser. No. 09/323,870, filed Jun. 1, 1999 now U.S. Pat. No. 6,468,699.

BACKGROUND OF THE INVENTION

1. Field of the Invention

The present invention pertains to photorefractive materials that are used as holographic storage materials and, particularly, to methods and materials for optical fixation of information in the photorefractive materials for long term storage where the information can be read out nondestructively with a uniform beam, archived for long term storage, and erased if desired.

2. Description of Prior-Art

In volume data storage, information is stored in the form of holograms throughout the three dimensional volume of a light sensitive material. Volume data storage offers great potential for extremely dense mass storage and fast information processing. For example, it is possible to store a terabyte or more of data on a one-centimeter cube.

Photorefractive materials, such as ferroelectric materials, are most suitable for read and write or read-only volume memories. The term "photorefractive effect" refers to changes in the index of refraction of an electro-optic material when the material is illuminated with non-uniform light. The index of refraction is defined as the ratio of the speed of light in a vacuum to that in a material.

Photorefractive materials possess suitable traps that are partly occupied by photosensitive electric charges. The traps originate in the material as a result of natural defects during crystal growth. These defects can occur whether the crystal is doped or undoped. Traps can be increased or enhanced by doping. These defects are mechanical flaws in the lattice structure, e.g., through the lattice structure missing atoms at some lattice sites.

A great variety of photorefractive materials is known to exist including organic and inorganic materials. For example, Rakuklujic and Yarviv, *Photorefractive materials for optical computing and image processing,* SPIE Vol. 881 Optical Computing and Nonlinear Materials (1988) describes a number of well known materials including $BaTiO_3$, SBN, BSKNN, $LiNbO_3$, $KNbO_3$, BSO, GaAs, and InP, which all demonstrate photorefractive effects that may also be enhanced by doping. The Rakuklujic et al. article mathematically defines terms including steady-state change in the refractive index, response time, and photorefractive sensitivity. The article provides a plurality of material parameters for each material, in both doped and undoped form. These parameters include data corresponding to the wavelength of light that induces a photorefractive effect in each material. The refractive index and photorefractive response time are listed for many materials, e.g., the materials can be selected to vary the photorefractive response time from one second to 100 picoseconds.

The family of tungsten bronze structures has been studies for its photorefractive effect, as reported in Neurgasonkaur et al, *Development and modification of photorefractive properties in the tungsten bronze family crystals,* 26 Optical Engineering No. 5 pp. 392–405 (May 1987), as well as in R. R. Neurogaonkar et al., *Photorefractive tungsten bronze materials and applications,* SPIE Vol. 1148 Nonlinear Optical Properties of Materials (1989).

As shown by the aforementioned articles, dopants may be added to the crystal melt to grow crystals having relatively more or less defects than would form during the growth of an undoped crystal. A dopant is typically an atom having a different oxidation state, ionic radius, or affinity for surrounding materials, than the other atoms that are normally found in the lattice. In practice, dopants can insert themselves into the lattice structure to either create or compensate defects, or dopants can decorate the surface of polycrystalline grains. Photorefractive materials are usually doped with a single or multiple dopant species to improve their refractive properties. For instance, lithium niobate is usually doped with iron, of various oxidation states to increase the sensitivity of the material to light. Other dopants that have been used to enhance the photorefractive effect include Ce, Cr, and Mn in various valence states, though an oxidation state of +3 is often preferred. Other dopants of similar oxidation states and which are similarly situated on the periodic table can also be used.

The Electro-optic Effect—Trap-charge Theory of Refractance

Holograms are written into photorefractive materials by the action of light on these materials according to the well-known photorefractive effect. The action of light of certain wavelengths and/or activation energy over time produces local field distortions that are associated with an increase or decrease in refraction. The localized differences in refraction are capable of storing data in the form of a trapped image. Two significant problems in the art include fading of the trapped image with time by dissipation of the image during storage or fading of the image during readout. The nonlimiting discussion below provides a generalized theory of why these two image fading phenomenon occur. Other image fading mechanisms may also play a role in the fading phenomenon. Only one technique, namely, that of thermal fixation, has been developed to overcome the problem of image fading during readout. No techniques have been developed to overcome the problem of image dissipation over time in storage conditions. Failure to overcome the problem of image dissipation during storage conditions precludes the use of holograms for long term archival storage.

In a photorefractive material, photosensitive charges move within the material under the influence of light. FIG. 1 illustrates a photorefractive material 100 having a plurality of trapped photosensitive electric charges 102 and 104, as well as the motion of these charges when they are excited by light 106. When the photorefractive material 100 resides in darkness, the photosensitive electric charges 102 and 104 remain where they are originally located. Illumination of the photorefractive material 100 by light 106 excites the photosensitive electric charges 102 and 104 to a mobile state 108 causing the charges to leave their original locations and migrate through the crystal by one or more charge transfer mechanisms 110 and 112.

The charge transfer mechanisms 110 and 112 are often referred to in the art as drift 110 and diffusion 112. Drift 110 occurs when photosensitive charges 102 and 104 move under the action of a static electric field that is applied to the material. Diffusion occurs because the photosensitive charges 102 and 104 tend to move from regions of high light intensity to regions of low light intensity. The photosensitive electric charges 102 and 104 migrate through the crystal structure by these mechanisms until they are eventually retrapped, e.g., as at site 114 following a relaxation of energy along pathway 116.

Excitation of trapped charges 102 and 104 by light 106 causes the charges to move away from the light 106 by drift 110 and diffusion 112 until they are retrapped at other sites, e.g. site 114. When a photosensitive electric charge, e.g., charge 102 or 104, migrates, it leaves behind an immobile ionized trap 118, e.g., trap 118. This trap creates a space charge electric field, which distorts the material lattice and, consequently, modulates the index of refraction of the material via the electro-optic effect, as explained in more detail below.

FIG. 2 shows two coherent light beams 200 and 202, which intersect across a three dimensional region 204 within a photorefractive material to create a spatially periodic light interference pattern, as shown in interference pattern 300 of FIG. 3. The periodic light interference pattern 300 excites photosensitive charges in the material, which migrate away from the light by diffusion and drift in the manner described with respect to FIG. 1. The motion of the charges disturbs the charge equilibrium that was present in the material before illumination. This disturbance sets up a corresponding electronic charge distribution 302, which, in turn, creates a corresponding periodic space charge electric field 304 within the material. In turn, the space charge electric field 304 modulates the index of refraction of the material via the electro-optic effect. The refractive index change modulation 306 is called an index grating and constitutes a hologram. The electric field 304 and the index of refraction 306 have the same periodicity as the light pattern, but are shifted in phase.

The prior art process of charge migration that results in the index of refraction 306 is a reversible one. Long term thermodynamic stability in the crystal favors an evenly distributed space charge that reverses the photorefractive effect in prior art crystals. When the photorefractive material is left in the dark, the changes forming the index of refraction 306 subside slowly to a uniform distribution corresponding to the initial state of the photorefractive material. The hologram thus persists in the photorefractive material until the changes in the index of refraction 306 disappear and the charge equilibrium is substantially restored in the material. The period of time that the hologram remains in the material in the dark is a function of the material's dielectric constant and is known as the material dark storage time. The dark storage time varies from milliseconds to a few months depending on the type of photorefractive material.

The index of refraction 306 is read by illuminating the photorefractive material with a uniform light beam to reproduce the stored image. This process of reading, according to the prior art, accelerates degradation of the stored image because the applied light evenly redistributes the photoexcited charges to cancel the space charge electric field 304. Accordingly, the changes in the index of refraction 306 vanish, and the hologram or index of refraction 306 to erases. The rate of hologram erasure in a photorefractive material when it is illuminated with a uniform light beam depends on the parameters of the material, the intensity and wavelength of the uniform beam, and the strength of the recorded hologram. Generally, this phenomenon of hologram erasure upon image readout is a tremendous problem in the art.

Conventional Read/Write Technologies

As discussed above, information consisting of a bit array or image is recorded in a photorefractive material in the form of holograms. Holograms are recorded in a photorefractive material by intersecting two coherent light beams, e.g., e.g., beams 200 and 202, where one beam is known as the object beam 200 and the other beam is known as the reference beam 204. The object beam 200 carries information while the reference beam 202 represents a spatial address that used to reference the information for readout from the photorefractive material. The information is often encoded in the object beam 200 using a page composer, which is a modulating device such as an electrically or optically addressed spatial light modulator, which encodes the incoming object beam with a light pattern.

A hologram recorded in a photorefractive material is reconstructed by blocking the object beam 200 and illuminating the material with the reference beam 202. When the reference beam 202 impinges on the photorefractive material, some of the light is deflected by the index grating in the direction of the object beam. Two beams emerge from the material, i.e. the reference beam and a replica of the object beam. The replica of the object beam is known as the diffracted beam and represents the reconstructed hologram. The reconstructed hologram, which is usually intercepted by a detector array or a charge coupled device for further processing, is short lived, according to prior art materials and practices. Its lifetime is limited to few'seconds or minutes depending on the material.

There are various known methods to record multiple holograms in a photorefractive material and read them out selectively. These methods are known as angular addressing, wavelength multiplexing, and light modulation addressing. In angular addressing, the angle that is formed by the intersection of the object beam and the reference beam during recording serves as the hologram address. Multiple holograms can thus be recorded in the storage material by varying the angle between the object and reference beam. A particular hologram is read from the photorefractive material by blocking the object beam 200 and illuminating the photorefractive material in the angular position that was assigned to the hologram during recording.

In wavelength multiplexing, multiple holograms are recorded in a storage material with reference beams that are plane waves of different wavelengths. Each wavelength corresponds to a hologram address. Stored holograms are read from the photorefractive material by illuminating the material with the plane wave reference beam of the specific wavelength that is assigned to it during its recording.

In light modulation addressing, the reference beam is encoded with a light pattern, which constitutes a hologram address. Different light patterns are assigned to different holograms. A transparency or a light modulating device such as an electrically or optically addressed spatial light modulator encodes the reference beam with an address pattern. During hologram readout, the encoded reference beam illuminates the storage material.

Read-out Erasure and Dark Storage

The main drawbacks of volume holographic storage in photorefractive materials is erasure of holograms as they are read out from storage and gradual dissipation of the stored image that naturally occurs even when the storage material is maintained in total darkness. The read-out erasure problem occurs by the action of light to produce an additional photorefractive effect that destroys the stored image as the trapped interference pattern is being read-out.

Efforts to remedy this problem have resulted in various techniques to preserve the information stored in photorefractive materials. For instance, heating the photorefractive material to high temperatures creates an ionic replica of the hologram recorded in the material. The ionic replica of the hologram persists against uniform light illumination and solves the read-out erasure problem, but the stored image still continues to degrade during storage, e.g., even during storage in the dark. Even the best thermally preserved images tend to exhibit complete or substantial degradation after about five or six months of dark storage. When the material is reheated to a higher temperature than the temperature used for fixing, the ionic replica vanishes.

Holograms are also fixed when a high voltage is applied across a photorefractive material. This electrical fixation forms a replica of the hologram that is recorded in the photorefractive material. The replica of the hologram is stable for many hours against uniform illumination by the reference beam. The replica of the hologram erases when an external field is applied again across the photorefractive material during uniform illumination.

A third technique that yields non-destructive hologram readout requires that the wavelength used for writing the hologram be different than that used for reading it out. The material is usually less sensitive to the wavelength used for reading out the hologram. Another technique uses the same wavelength for writing and reading out the hologram but requires that the polarization of the recording beam be orthogonal to that of the readout beam. Techniques that are used to refresh the information, e.g., as by recalling and rewriting the stored image, can also be used to counter hologram erasure in a photorefractive material.

The conventional fixing methods that are described above have not yet been applied to commercial devices because they present several drawbacks for commercial storage systems. Some of the limitations of each of these techniques are outlined below:

a. Thermal fixing requires a heating surface such as an oven to bring the material to high temperatures, which are very impractical because commercial storage systems must be small, fast, compact, and safe;

b. Electrical fixation requires large power supplies to achieve the voltage levels necessary for hologram fixation;

c. Information loss occurs when different wavelengths are used, and two different lasers are required, which renders the system complex and expensive;

d. When a single laser is used to read and write data, a device that switches the polarization of the reference beam during readout is required, which makes the system speed dependent on the speed of the switching device;

e. When different polarization's are used for hologram recording and readout, information can only be read out for few hours, and two lasers are required, which makes the system complex and expensive;

f. System refresh techniques result in information loss and require a complex system design while these techniques do not fix the data permanently and, while they recreate a replica of the hologram every time the hologram is read out, the quality of the image degrades with each refreshed writing; and g. None of the technologies that have been developed to date overcome the problem of image dissipation that occurs even under dark storage conditions.

There remains a need for a method and apparatus for solving the problem of hologram erasure that occurs during readout of holograms, as well as in storage conditions. Commercial memory storage devices require that a hologram should be written into a photorefractive material, fixed for permanent storage, and selectively erased if erasure is desired. It is also necessary for most applications that the stored image must demonstrate no loss in quality after multiple readouts, not demonstrate appreciable dark storage degradation over the lifetime of the device, and not demonstrate appreciable degradation as the image is read-out.

The method and apparatus should be practicable without expensive optical components, such as a polychromatic polarized laser light source or rotating polarizing filters.

Solution

The present invention overcomes the problems outlined above by providing method and apparatus for implementing an all-optical and reversible technique that solves the problem of hologram erasure or fading in photorefractive materials both during image readout and during storage conditions. Holograms are permanently stored in photorefractive materials by using incoherent ultraviolet light to fix the holograms for indefinite preservation and storage in the photorefractive material. The stored holograms may be read out non-destructively and erased, as desired. The technique is a major breakthrough that advances volume storage in photorefractive materials toward commercial systems having practical and economical applications.

It has been discovered that holograms are fixed in a doped or undoped photorefractive material when the photorefractive material is irradiated with fixing radiation from the ultraviolet light, gamma radiation, or X-ray spectra. Ultraviolet light is particularly preferred, and polychromatic ultraviolet radiation having a wavelength from 200 to 400 nm is especially preferred. While ultraviolet light has traditionally been used to erase holograms, a lower level of exposure to ultraviolet light is now shown to fix the images for permanent storage that resists image fading during readout or during storage conditions.

The process is an all optical process where the fixing radiation can be coherent or incoherent light. Ultraviolet light refers to light radiation that is made up of a collection of wavelengths in the ultraviolet light spectrum, and is preferably a subportion of this spectrum, such as deep UV, that is tuned to match the sensitivity of a particular photorefractive material. The information contained in the holograms is frozen indefinitely in the material, and is stable against uniform illumination of the material. The fixed holograms are also erased by further irradiation with ultraviolet light thus making the process reversible. The ultraviolet light that is used for both the image fixing process and the erasure process is preferably incoherent ultraviolet light.

The new fixation technique is considerably less expensive than prior fixation techniques. Additionally, the electro-optical properties of a light sensitive material are changed when it is irradiated with ultraviolet light. These new materials can be substituted for known materials of similar composition in devices including gyroscopes and optical switches in telecommunications systems where the photorefractive material is stabilized against imprint. The change in electro-optical properties can also be used to enhance the recording and erasure characteristics of a photorefractive material, and stronger light can advantageously be used to readout images without image degradation.

Aspects of the present invention include:

a. providing a reversible technique to fix holograms in a photorefractive material for long term storage and erase them optically;

b. providing a repeatable and robust method that can be used to fix holograms in a doped or undoped material and erase them;

c. providing a simple and practical method to control the state of information stored in photorefractive materials;

d. providing ways to design compact high-capacity volume memories;

e. providing ways to advance this technology toward commercial compact storage systems;

f. providing a method for designing archival systems;

g. providing means to develop economical high-capacity volume memories since the process detailed in this invention is used with both incoherent light and incoherent light;

h. providing a method to preserve information in photorefractive materials without the use of complex and expensive hardware;

i. providing the option to design archival read only and read and write information storage systems;

j. providing novel ways to further understand light interaction in photorefractive materials so that their properties can be optimized for various optical processing applications;

k. providing ways to alter the light properties of a light sensitive material;

l. providing a technique to enhance the recording and erasure characteristics of photorefractive materials; and m. providing new materials having substantially improved electro-optical properties for optical image and information processing systems, as well as for other electro-optical systems including at least gyroscopes and optical switches.

Further objects and advantages are to provide a universal technique to fix information permanently in different doped or undoped photorefractive materials. Moreover, this invention will pave the road for material developers to devise novel materials for optical processing applications. Still further objects and advantages will become apparent from a consideration of the ensuing description and drawings.

DETAILED DESCRIPTION OF THE PREFERRED EMBODIMENT

Schematic System Diagram

Figure 4:
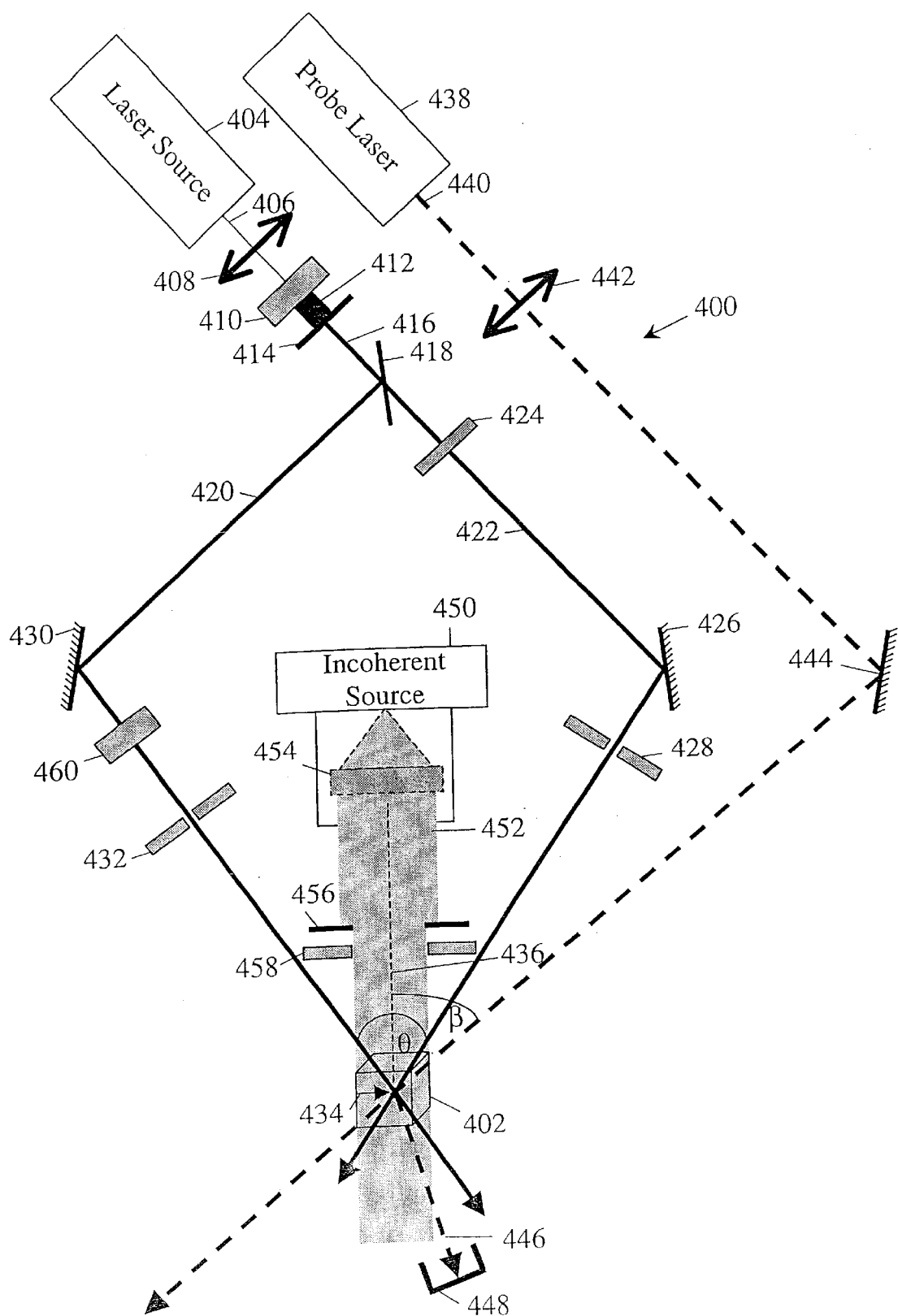
FIG. 4 shows an experimental setup for recording, reading out, and fixing holograms in a storage material, as well as erasing fixed holograms from a storage material.

FIG. 4 shows a holographic image recording and reading system 400 according to the present invention. System 400 is used to record and fix holograms in a storage material 402, as well as for reading the stored holograms, erasing the stored holograms, and for altering the optical recording and erasure characteristics of the storage material 402.

A laser source 404 emits a laser beam 406, which passes through a polarizer 408. The polarization of the laser beam 406 is usually set horizontal, but may include any combination of s-polarized and p-polarized components to provide linear, circular, or elliptically polarized light. The laser beam 406 passes through an optics assembly 410 comprising lenses, a spatial filter, and beam expander to provide an expanded laser beam 412. An iris 414 positioned behind the optics assembly 410 limits the diameter of the expanded laser beam 412 to a laser beam 416 of the desired size. The laser beam 416 impinges on a beam splitter 418 where it is divided into an object beam 420 and a reference beam 422. The reference beam 422 passes through an optional light attenuator 424, which is selectively used to control light intensity, as desired.

A mirror 426 stirs the reference beam 422 toward the storage material 402. A shutter 428 is positioned in the path of the reference beam 422. Similarly, the object beam 420 is directed toward the storage material 402 by a mirror 430. A shutter 432 is positioned in the beam path of the object beam 420. Shutters 428 and 432 alternatively allow the reference beam 422 and the object beam 420 to propagate towards the storage material 402 or block them from reaching it. The reference beam 422 and the object beam 420 intersect within the storage material 402 in a plane defining an angle α between the center of the object beam 420 and the reference beam 422. The optical axis 434 of the storage material 402 is usually set horizontal and perpendicular to the bisector 436 of the object beam 420 and the reference beam 422.

An optional probe laser 438 is used to monitor hologram recording and erasure continuously. The wavelength of the probe laser 438 is usually different from that of the laser source 404, and its intensity is set relatively low to that of laser 404. Consequently, hologram recording and erasure are monitored, but holograms are not significantly affected by the probe laser 438. The probe laser 438 emits a probe beam 440, which passes through polarizer 442 to receive a polarization that is usually set horizontal, but may include any combination of s-polarized and p-polarized components to provide linear, circular, or elliptically. polarized light matching the polarization that was used when storing a particular image in storage medium 402 through the use of laser source 404. An adjustable mirror 444, which can be moved in the x, y, and z directions, stirs the probe beam 440 toward the storage material 402. The probe beam 440 makes an angle β with the bisector 436 of the object and reference beams. The angle θ is selected so that the probe beam 440 reads out a hologram present in the storage material 402. This selection yields a diffracted beam 446, which is captured by a detector 448. The ratio of the light intensity in the diffracted beam 446 to that of the probe beam 440 measures the diffraction efficiency of the hologram present in the storage material 402.

An incoherent source 450, e.g. a deuterium lamp, radiates ultraviolet light by emitting an incoherent light beam 452. The incoherent light beam 452 usually passes through collimating optics 454 and then an iris 456 to define a diameter. A shutter 458 is positioned in path of the incoherent light beam 452 to allow passage of beam 452 or block beam 452 from reaching the storage material 402.

Those skilled in the art appreciate that the system 100 may be modified to according to conventional principles to produce a similar result in reading and writing information. For example, the probe laser 438 may be eliminated, with read-out then being performed by the reference beam 422. Multiple sources like source 450 may be used to emit a variety of wavelengths, and fixing radiation from these sources may impinge upon the storage material 402 from any direction.

Storage Materials

The storage material 402 is any bulk transparent photosensitive electro-optic material that displays the photorefractive effect, i.e., the storage material registers non-uniform light variations as changes in the index of refraction via the electro-optic effect. The storage material is either undoped or doped with a single or multiple dopant species. The faces of the storage material are usually highly polished to minimize light scattering. Multiple unfixed holograms can be recorded in the volume material by conventional techniques including angular, wavelength, or spatial light modulation multiplexing. Furthermore, erasure of recorded holograms always occurs during hologram readout, unless some additional effect is created in the storage material to stabilize the holograms against uniform illumination.

Figure 1:
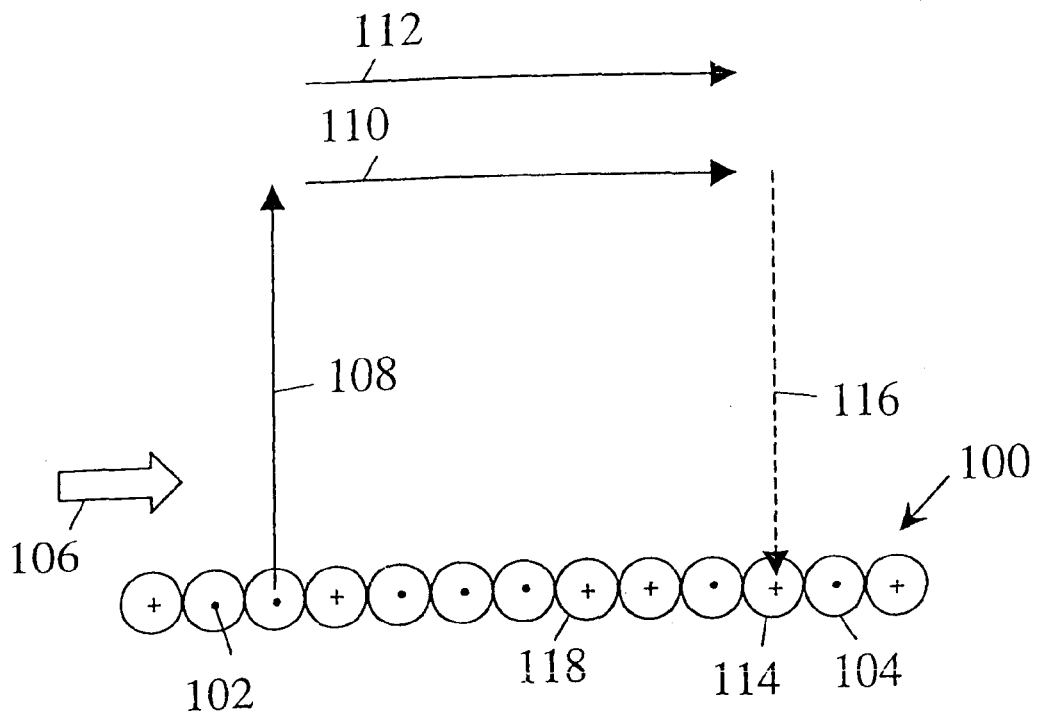
FIG. 1 shows a photosensitive electric charge, which moves from a trap by drift and diffusion under the influence of light and is captured at a different site within a storage material.
Figure 2:
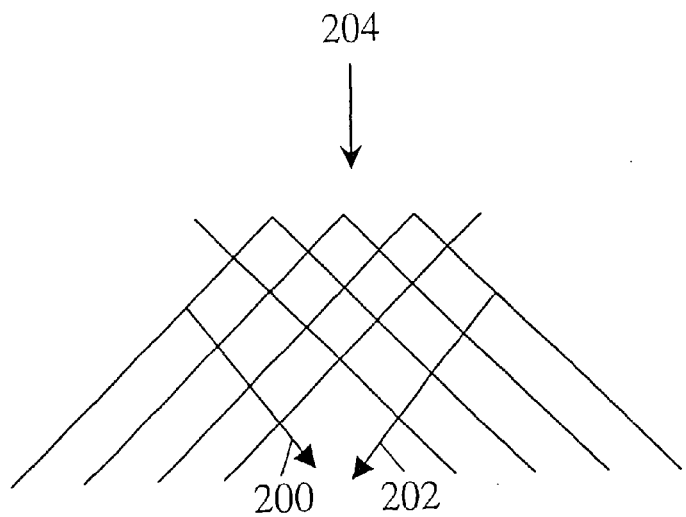
FIG. 2 shows a light interference pattern in a photorefractive storage material.
Figure 3:
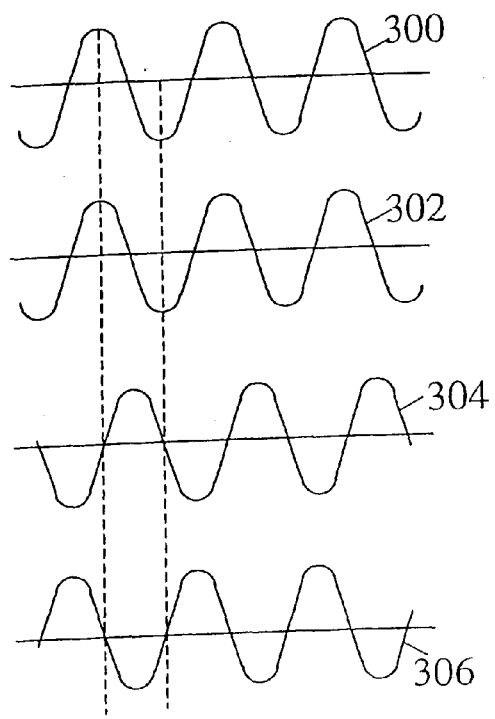
FIG. 3 shows an electronic charge distribution, a periodic space charge electric field, and a modulation of the index of refraction when two beams interact within a storage material.

The storage material possesses photosensitive traps that are due to defects that form naturally during crystal growth or as a result of doping. When the storage material is illuminated with light of suitable wavelength, the traps are excited and liberate charge carriers, as described above with respect to FIGS. 1 and 2. The charge carriers move within the material by diffusion and drift away from the light until they are retrapped at other sites. When a charge migrates within the storage material, it leaves behind a static ionized trap. The ensemble of trapped charges and ionized traps sets up a space charge electric field within the crystal. The space charge electric field modulates the index of refraction of the storage material via the electro-optic effect. The space charge electric field and the index of refraction follow the same spatial functional dependence as that of the non-uniform light pattern.

In absence of a practicable fixing technique, the space charge electric field that is created in the material remains for a finite period of time if the storage material is stored in the dark. The trapped photosensitive charges redistribute causing the space charge electric field to cancel when the storage material is illuminated with a uniform beam. Both of these problems cause fading of the stored image until such time as the image is fixed. The incoherent ultraviolet source 450 together with the optional optics for processing beam 454 provide a practicable all-optic fixing means that overcomes these problems.

Any photorefractive material can be used for the storage material 402. Materials with high dielectric constants are preferred because they have more ability to refract light due to the electro-optic effect that is discussed in reference to FIG. 1. Ferroelectric materials, especially perovskite and tungsten bronze materials, are particularly preferred where these materials may also be doped to enhance the photorefractive effect. Lead titanate and strontium titanate are especially preferred. Iron-doped lithium niobate is most preferred.

System Operation

1. Hologram Fixing

After a hologram has been stored in the storage material 402, the storage material 402 is irradiated with any electromagnetic radiation having a wavelength that is capable of fixing the image in the storage material. This wavelength is typically in the x-ray or ultraviolet spectrum, and is preferably incoherent. The exact wavelength for fixing purposes may vary depending upon the type of storage medium, but the radiation typically falls within the ultraviolet spectrum, and especially the deep UV or high x-ray spectrum. A broadband ultraviolet emission permits a single ultraviolet source 450 to be used for fixing holograms in a variety of different storage media.

It has been determined according to the principles of this invention that the UV, X-ray and even gamma radiation bands have wavelengths that induce corresponding effects in crystals. These effects, while not completely understood, are thought to be uncompensated point charge defects that, themselves, compensate the trapped field 304 without altering the stored images where these images have been stored in crystals by using the photorefractive effect. The effects of fixing radiation disrupt the image dissipation mechanism that dissipates the stored images under read-out and dark storage conditions. No other fixation technique overcomes both the problem of dissipation in dark storage and read-out erasure.

Exposure to ultraviolet radiation for the proper amount of time and intensity permanently fixes the stored hologram in the storage medium until such time as overexposure to additional amounts of ultraviolet radiation erases the stored image. Exposure time depends upon the type of photorefractive material that is being used, and should be sufficient to fix the stored hologram in the medium, but not so long as to erase the hologram.

In summary, this all-optical fixing process requires that
  a. the information or data be already present in the photorefractive material before the material is irradiated with incoherent ultraviolet light (or other fixing radiation) to fix the information in storage, or
  b. the information is being recorded in the photorefractive material while the material is irradiated with ultraviolet light, and
  c. the intensity of the incoherent ultraviolet light is sufficient to fix the image and the photorefractive material is irradiated for a duration that does not cause erasure of the stored image.

FIGS. 5–12 illustrate use of the system 400 that is shown in FIG. 4 to provide several techniques for fixing information in a photorefractive material. The intensity of the object beam 420, the intensity of the reference beam 422, and the intensity of the incoherent light beam 454 are tuned to the requirements of the storage material 402.

Figure 5:
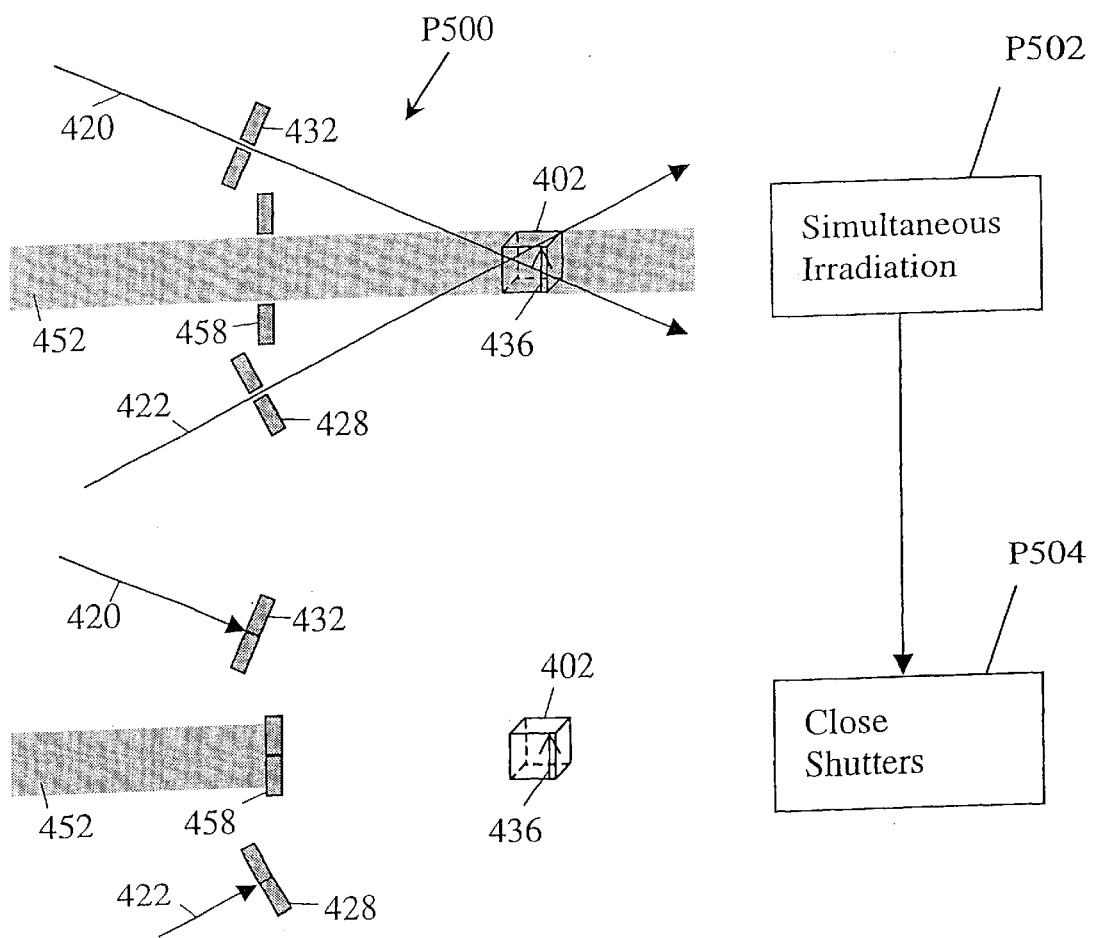
FIG. 5 shows a process and device configuration example for using light to fix information in a storage material.

FIG. 5 shows a process P500 for recordation of a hologram while the storage material 402 is simultaneously irradiated with incoherent ultraviolet light. Recording and incoherent ultraviolet irradiation are terminated concurrently. In step P502, shutters 428, 432, and 458 open concurrently for a period of time. The object beam 420 and the reference beam 422 interfere within the storage material 402 to produce a hologram concomitantly with the incoherent light beam 452 irradiating the storage material 402. The shutters 428, 432, and 458 close concurrently in step P504 to provide a completed fixed holographic image in storage material 402.

Figure 6:
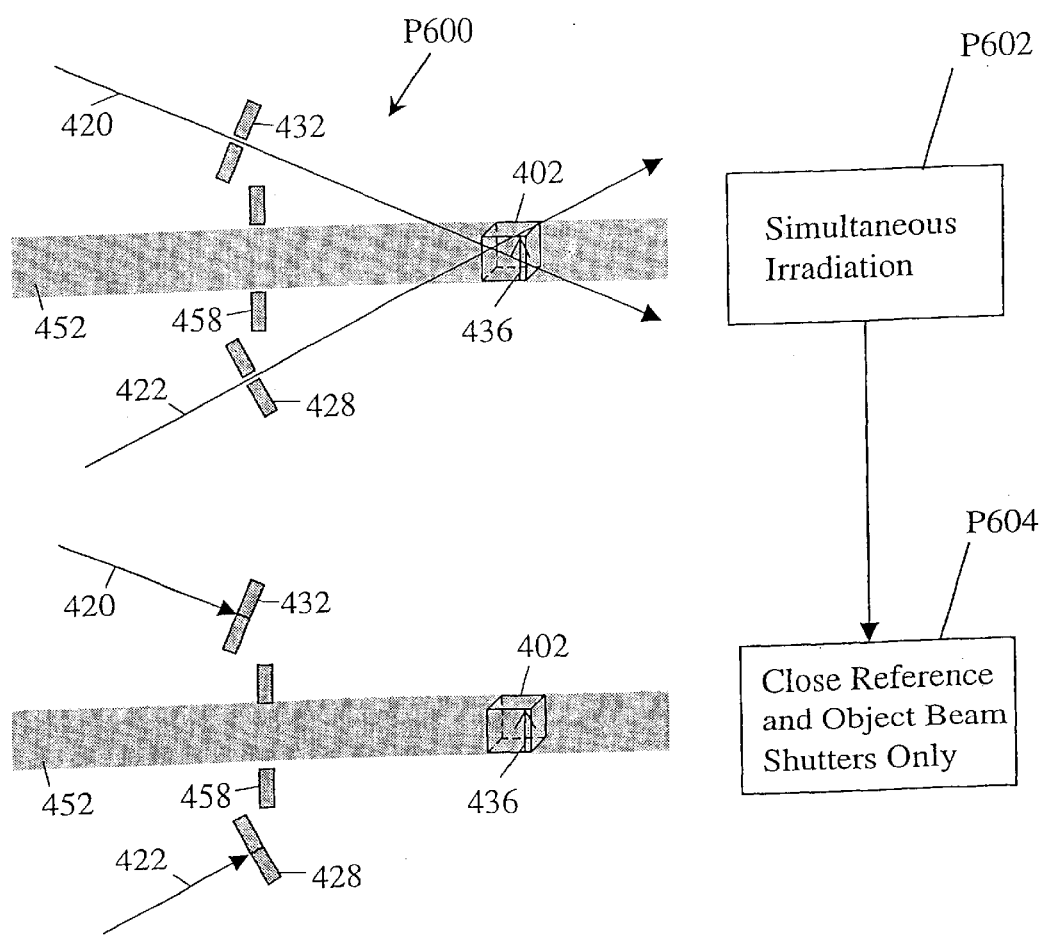
FIG. 6 shows another process and device configuration example for using light to fix information in a storage material.

FIG. 6 shows a process P600 with hologram recording concurrently with fixing of the stored hologram by incoherent ultraviolet irradiation of the storage material 402 where the recordation and fixing radiation start concurrently, but hologram recording finishes before incoherent ultraviolet irradiation is terminated. Shutters 428, 432, and 458 open simultaneously in step P602. The storage material 402 is illuminated concomitantly with the object beam 420, the reference beam 422, and the incoherent light beam 452 for a period of time that is required to store the hologram. After some time, shutters 428 and 432 are closed and shutter 458 remains open longer to complete fixing of the stored hologram.

Figure 7:
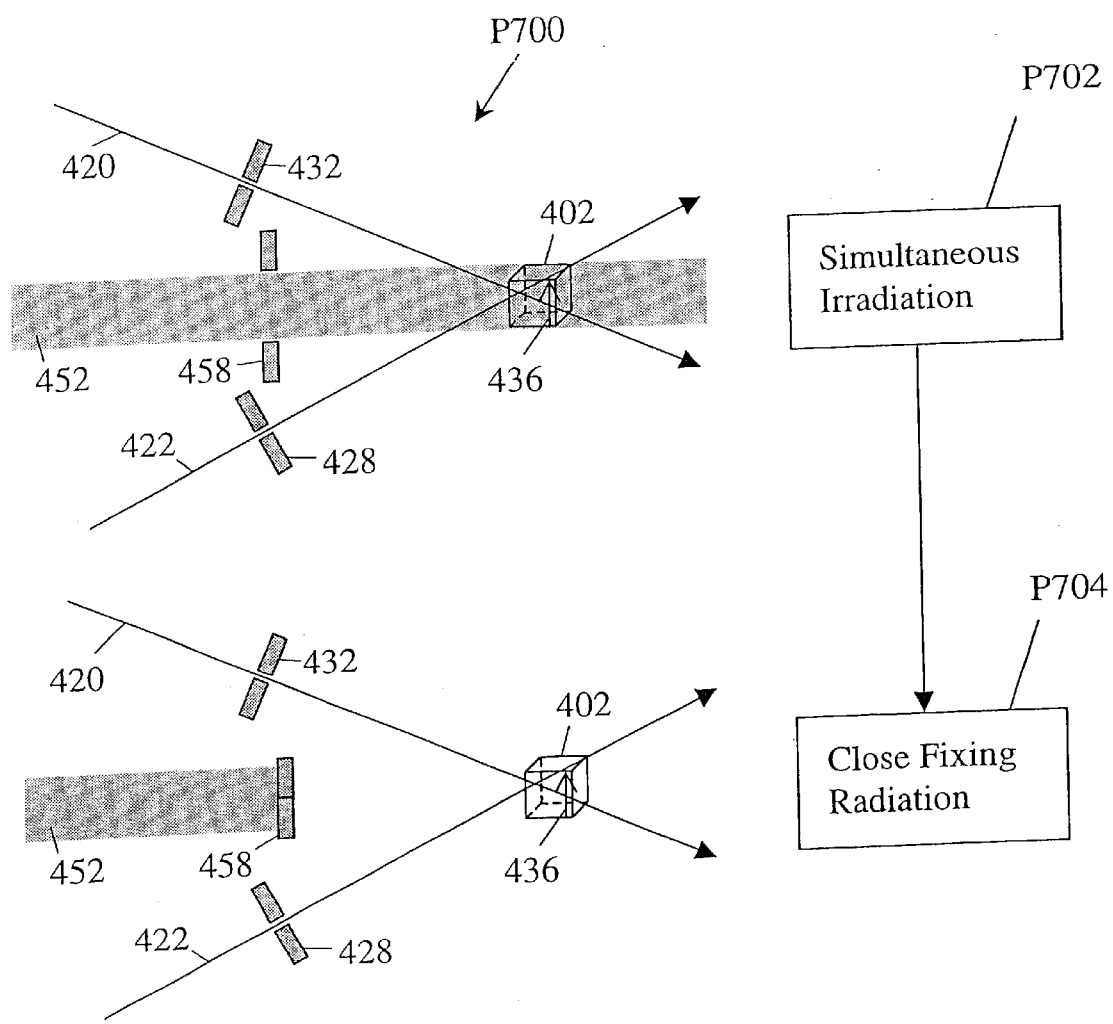
FIG. 7 shows yet another process and device configuration example for using light to fix information in a storage material.

FIG. 7 shows a process P700 with concurrent hologram storage and fixing of the stored hologram by incoherent ultraviolet irradiation of the storage material 402. Fixing of the stored hologram is then stopped while the object beam 420 and the reference beam 422 continue to interfere within the storage material 402. Shutters 428, 432, and 458 open simultaneously in step P702. In step P704, shutter 458 closes, alone, to permit the object beam 420 and the reference beam to continue interfering for the purpose of strengthening the hologram.

Figure 8:
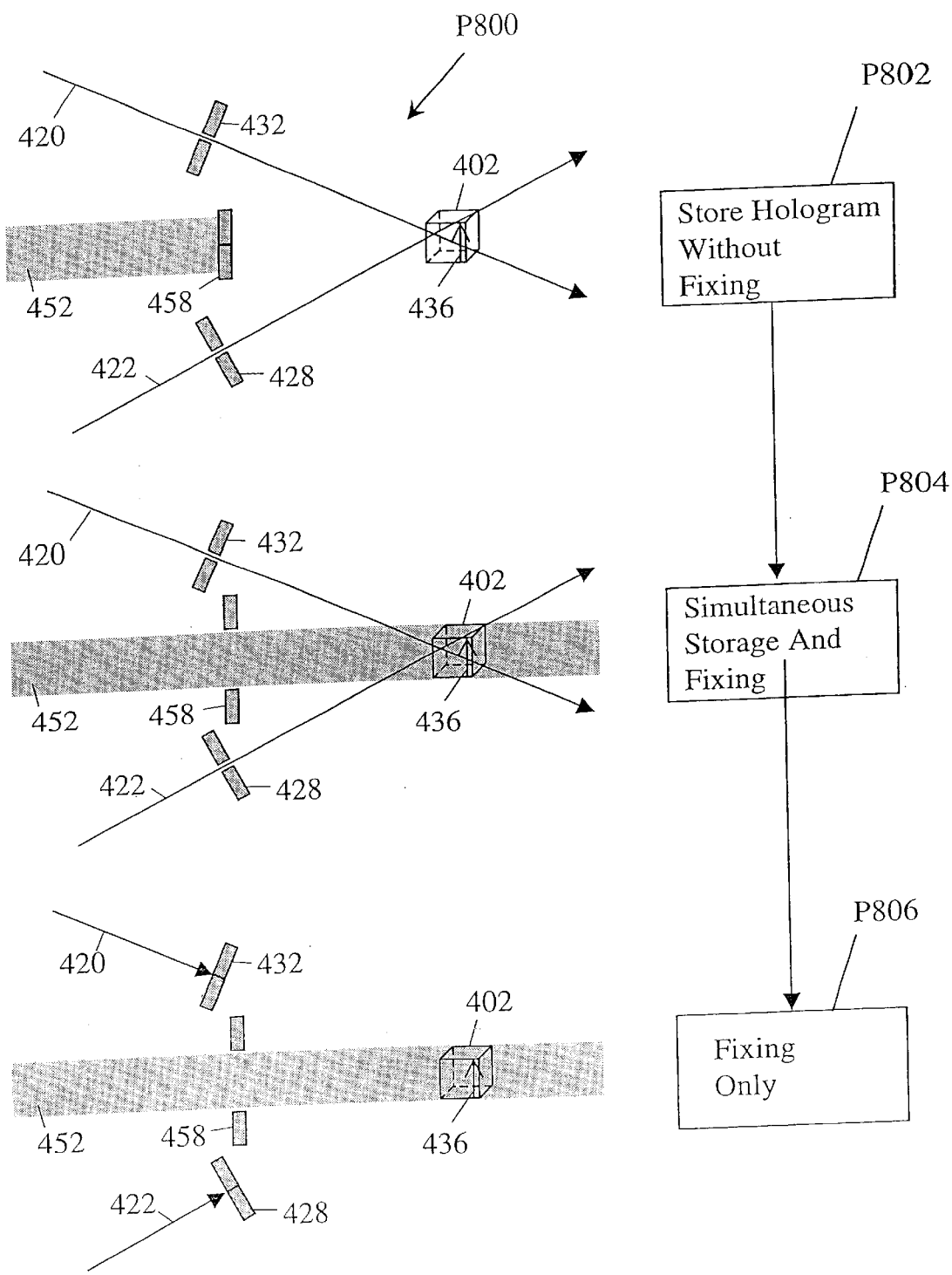
FIG. 8 shows yet another process and device configuration example for using light to fix information in a storage material.

In process P800 of FIG. 8, hologram recording in the storage material 402 starts before the material is irradiated with incoherent ultraviolet light and finishes before incoherent ultraviolet irradiation of the storage material is stopped. Shutters 428 and 432 are open for a period of time to permit the object beam 420 and the reference beam 422 interfere within the storage material 402 while shutter 458 is kept closed, all in step P802. In step P804, shutter 458 is opened to add ultraviolet radiation for simultaneous recordation and fixing of the hologram in storage material 402 The object beam 420 and the reference beam 422 interfere within the storage material 422 concomitant with the incoherent light beam 452 irradiating the storage material 402. In step P806, shutters 428 and 432 close while shutter 458 remains open longer to finish fixing the stored image.

Figure 9:
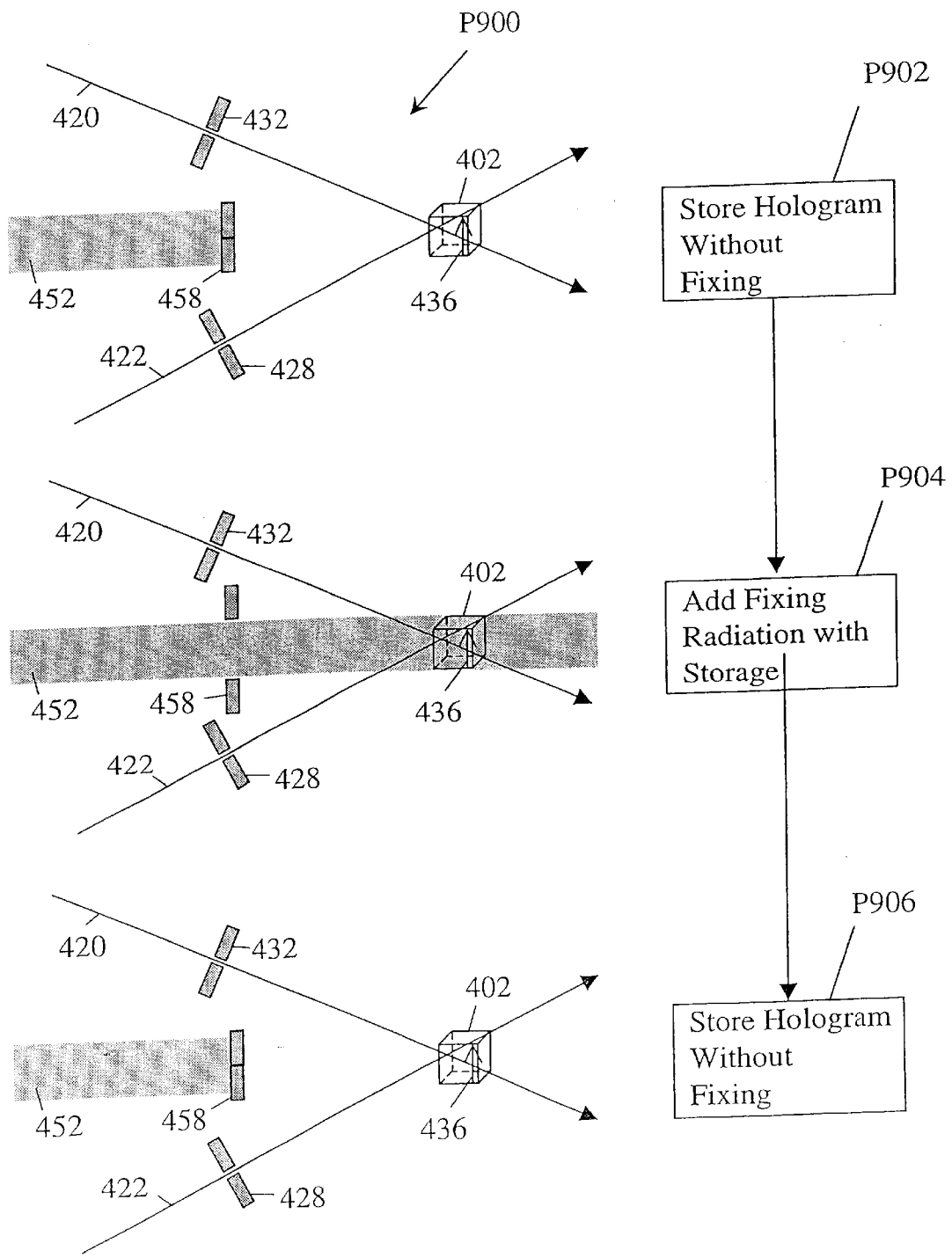
FIG. 9 shows yet another process and device configuration example for using light to fix information in a storage material.

Process P900 of FIG. 9 shows hologram recording in the storage material before the material is irradiated with incoherent ultraviolet light followed by irradiation with ultraviolet radiation. Additional image recording continues and finishes after incoherent ultraviolet irradiation is terminated. Shutters 428 and 432 open for a period of time in step P902 to permit the object beam 420 and the reference beam 422 to interfere within the storage material 402 while shutter 458 remains closed. Shutter 458 opens in step P904 for fixing of the stored image concurrently with storage of the image. The object beam 420 and the reference beam 422 continue to interfere within the storage material 402 concomitant with incoherent light beam 452 irradiating the storage material 402 for fixing of the stored hologram. Shutter 458 closes in step P906 to stop irradiation with ultraviolet light while shutters 428 and 432 remain open longer to continue storing the hologram.

Figure 10:
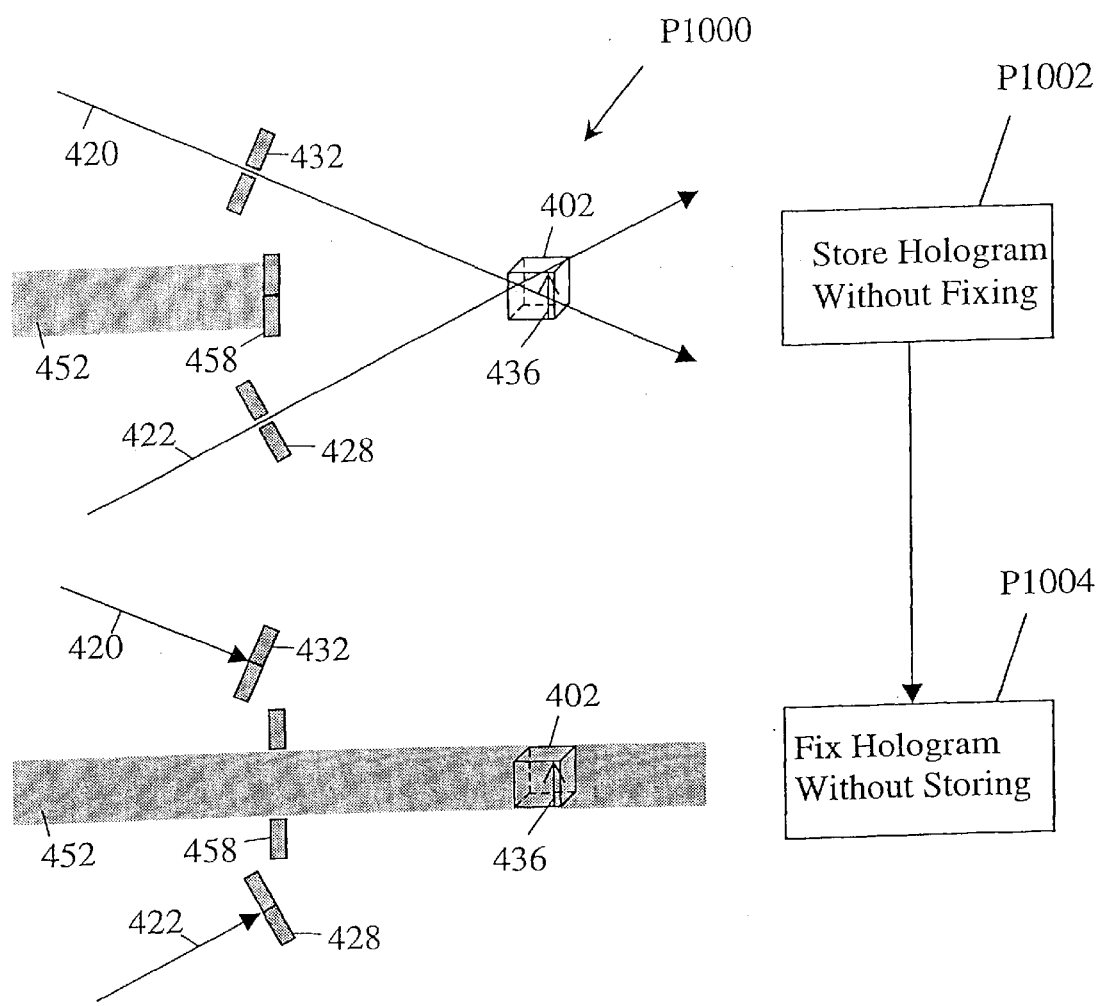
FIG. 10 shows yet another process and device configuration example for using light to fix information in a storage material.

Process P1000 of FIG. 10 shows the recordation of a holographic image before the application of ultraviolet radiation. Hologram recording is terminated and the storage material is irradiated with incoherent ultraviolet light. Shutters 428 and 432 open for a period of time in step P1002 to permit the object beam 420 and the reference beam 422 to interfere within the storage material 402 while shutter 458 remains closed. In step P1004, Shutters 428 and 432 are to cease storing the hologram while shutter 458 remains open to complete fixing of the stored image.

Figure 11:
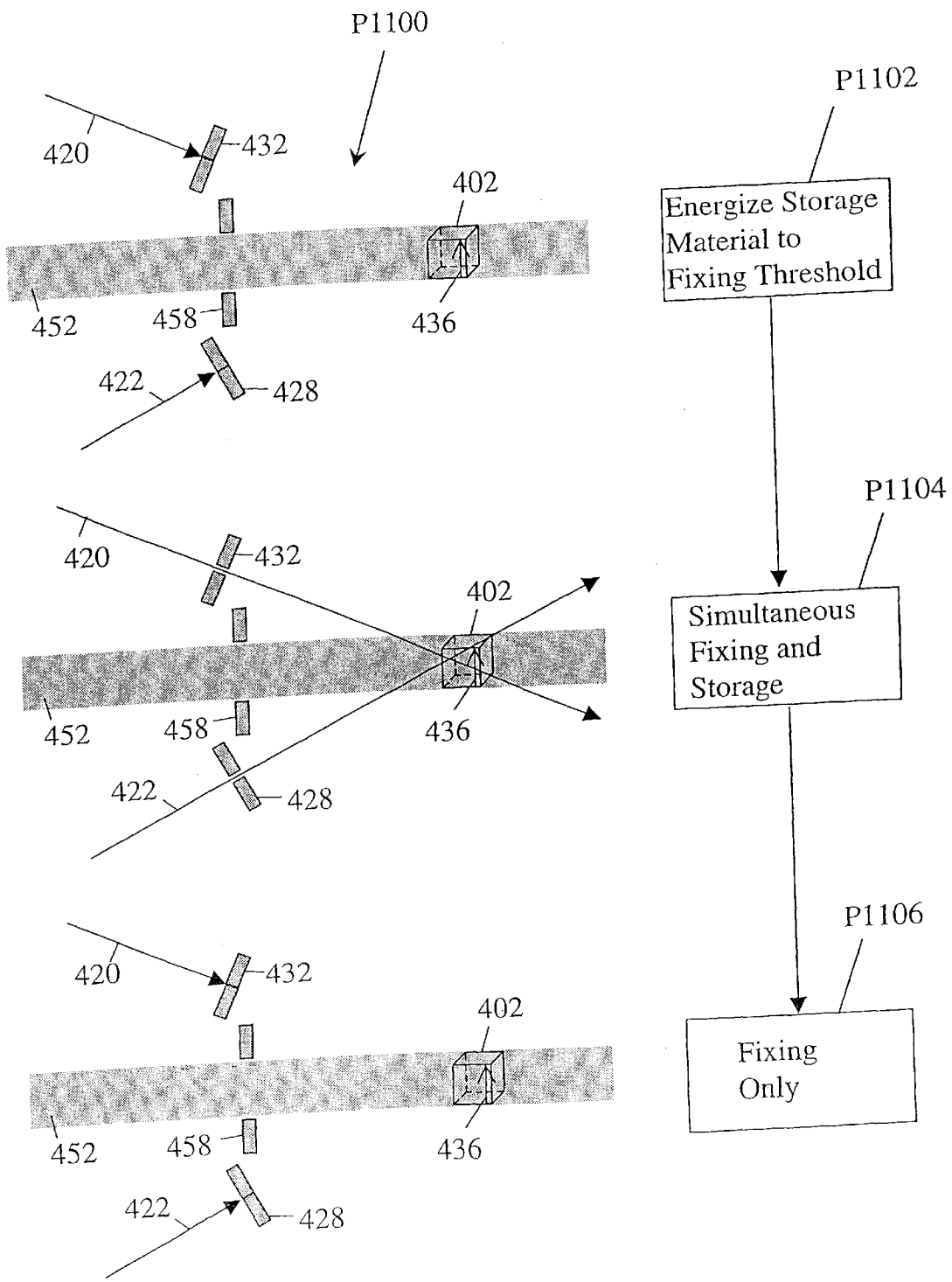
FIG. 11 shows yet another process and device configuration example for using light to fix information in a storage material.

In process P1100 of FIG. 11, the storage material 402 is irradiated first with incoherent ultraviolet light for a period of time followed by hologram recording while incoherent ultraviolet irradiation of the material continues with eventual termination of hologram recording before the incoherent ultraviolet irradiation ceases. Shutter 458 opens in step P1102 for a period of time while shutters 428 and 432 are kept closed to energize the storage material to a fixing threshold. The storage material is irradiated solely with incoherent ultraviolet light during this step. In step P1104, shutters 428 and 432 open to illuminate storage material 402 concurrently with the object beam 420, the reference beam 422, and the incoherent light beam 452 for simultaneous fixing and storage of the hologram. Shutters 428 and 432 again close in step P1106 while shutter 458 remains open longer to complete fixing of the stored image.

Figure 12:
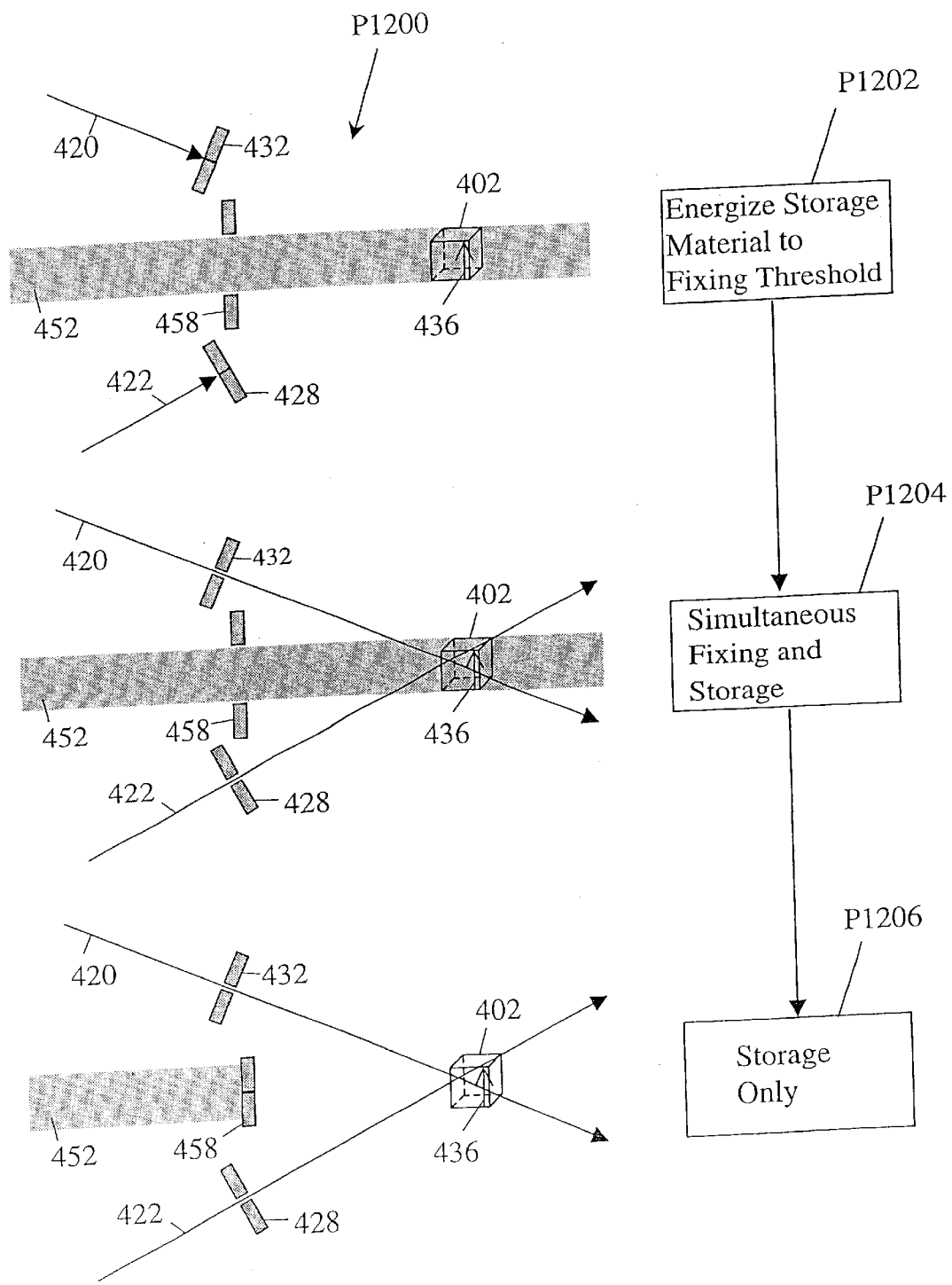
FIG. 12 shows yet another process and device configuration example for using light to fix information in a storage material.

Process P1200 of FIG. 12 entails first irradiating the storage material 402 with incoherent ultraviolet light followed by hologram recording while incoherent ultraviolet irradiation of the material continues. Ultraviolet irradiation ceases while recording to store information continues. In step P1202, shutter 458 is open while shutters 428 and 432 remain closed. The storage material 402 is irradiated only with incoherent ultraviolet light beam 452. Shutters 428 and 432 open in step P1204 and the storage material 402 is illuminated concurrently with the object beam 428, the reference beam 430, and the incoherent light beam 452. Shutter 458 closes in step P1206 while shutters 428 and. 432 are kept open to continue the hologram storage process without ultraviolet irradiation.

2. Method for Checking if a Hologram is Fixed in a Storage Material

Figure 13:
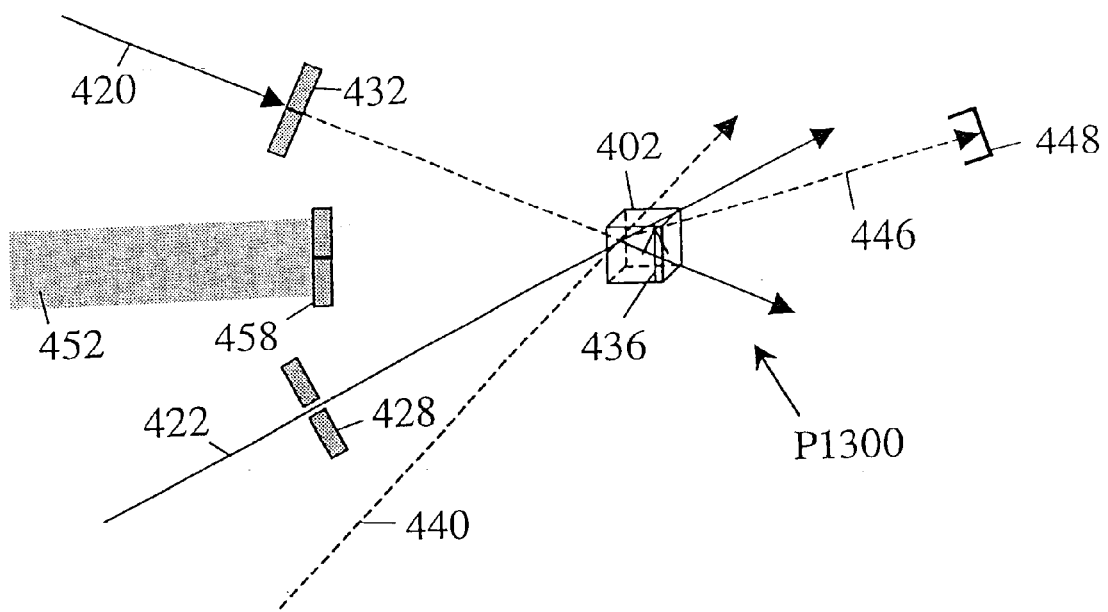
FIG. 13 shows a technique for checking if a hologram is fixed in the storage material.

FIG. 13 depicts a configuration of system 400 during a procedure to determine whether a hologram has been fixed in storage material 402 by any one of the processes shown in FIGS. 5–12. Shutter 428 is open while shutters 432 and 458 are kept closed. The storage material 402 is illuminated simultaneously with the reference beam 422 and the probe beam 440. The reference beam 422 and the probe beam 440 concurrently read out the hologram recorded in the storage material 402. The reference beam 440 reconstructs the hologram 1300 in the direction of propagation of the object beam 420 that was used to store the hologram 1300. The probe beam 440 generates a diffracted beam 446, which impinges upon a detector 448. In turn, detector 448 measures the intensity of the diffracted beam 446. When the hologram 1300 is not fixed, the diffracted beam 446 vanishes over time, i.e. the intensity of the diffracted beam decays to zero after some time. However, when hologram 1300 is fixed in storage material 402, the intensity of the diffracted beam 446 decays until it reaches a positive value, where it remains indefinitely. The ratio of this value to the intensity of the probe beam 440 determines the diffraction efficiency of the fixed hologram.

3. Relationship Between the Diffraction Efficiency of Fixed Holograms and the Time and Intensity for Fixing a Hologram with Incoherent Ultraviolet Light and Parameters of the Material A plurality of diffraction efficiency measurements can be performed to determine a relationship between the diffraction efficiency of a fixed hologram in a storage material, the intensity of incoherent ultraviolet light, and the time the storage material is irradiated with ultraviolet light is detailed below.

As described above, a hologram is fixed in photorefractive storage material by irradiating the storage material 402 for a minimum time with incoherent ultraviolet light or fixing radiation. The intensity of this fixing radiation is equal to or larger than a threshold intensity that is required to fix a holographic image for storage and varies depending upon the specific photorefractive material that is selected. The overall diffraction efficiency of a fixed hologram depends on various parameters, such as the intensity of the object beam, the intensity of the reference beam, the time the object and the reference beam interfere within the storage material, the angle between the object beam and the reference beam, the intensity of the incoherent ultraviolet light, the time the material is irradiated with incoherent ultraviolet light, and the parameters of the material such as size, thickness, doping, and sensitivity.

When the parameters including the intensity of the object beam, the intensity of the reference beam, the angle between the object beam and the reference beam, and the time the object beam and the reference beam interfere within the storage material do not change, the diffraction efficiency of the fixed hologram depends only on the time the material is irradiated with ultraviolet light and the intensity of the incoherent ultraviolet light. The relationship between the diffraction efficiency of the fixed hologram, the intensity of the incoherent ultraviolet light, and the time the material is irradiated with ultraviolet light is found as follows.

After storage of the hologram absent the application of fixing radiation, the storage material is irradiated with incoherent ultraviolet light of predetermined intensity for a predetermined time. The diffraction efficiency of the hologram is measured as described with respect to FIG. 13, where the diffraction efficiency is determined as the intensity of the stabilized diffracted beam 446 to the intensity of the probe beam 440. The intensity of incoherent ultraviolet light and the time the storage material is irradiated with incoherent ultraviolet light are varied and the procedure is repeated. When the hologram does not fix because either the time the material is irradiated with ultraviolet light is too short, or the intensity of the incoherent ultraviolet light is too low, or both, the diffraction efficiency of the fixed hologram is zero. The data is then fitted to a function that relates the diffraction efficiency of the fixed hologram to the intensity of the incoherent ultraviolet light and the time the material is irradiated with ultraviolet light. This function yields and predicts the minimum time that the material must be irradiated with incoherent ultraviolet light and the minimum intensity of incoherent ultraviolet light for fixing a hologram in a storage material to a desired diffraction efficiency.

The diffraction efficiency of a fixed hologram depends upon the time the material is irradiated with ultraviolet light, the intensity of the ultraviolet light, material-specific photorefractive parameters, the intensity of the object beam, the intensity of the reference beam, the time the object and the reference beam interfere within the storage material, and the angle between the object beam and the reference beam can be determined in like manner. For example, the relationship between the diffraction efficiency of a fixed hologram, the intensity of the incoherent ultraviolet light, the time the material is irradiated with ultraviolet light, and the thickness of the material is determined as follows. A plurality of holograms are fixed in a material of predetermined thickness with the process outlined in this invention for different intensities of incoherent ultraviolet light and different times of incoherent ultraviolet irradiation. Next, the thickness of the storage material is varied and the above procedure is repeated. The data is then fitted to a function that yields the functional dependence of the diffraction efficiency of the fixed hologram on the intensity of the incoherent ultraviolet light, the time the material is irradiated with ultraviolet light, and the thickness of the storage material.

Similarly, the dependence of the diffraction efficiency of a fixed hologram on the time the material is irradiated with ultraviolet light, the intensity of the incoherent ultraviolet light, any material parameter, the intensity of the object light, the intensity of the reference beam, the time the object and the reference beam interfere within the storage material, and the angle between the object beam and the reference beam is determined.

4. Erasure of Fixed Holograms

A hologram that is fixed in a doped or undoped photorefractive material is erased when the material is irradiated with incoherent ultraviolet light far beyond the minimum irradiation that is required to fix the hologram. This all-optical erasure process requires that a. the information be already fixed in the photorefractive material with incoherent ultraviolet light, and b. the intensity of the incoherent ultraviolet light is above a minimum and the photorefractive material is irradiated with incoherent light for a minimum time.

Figure 14:
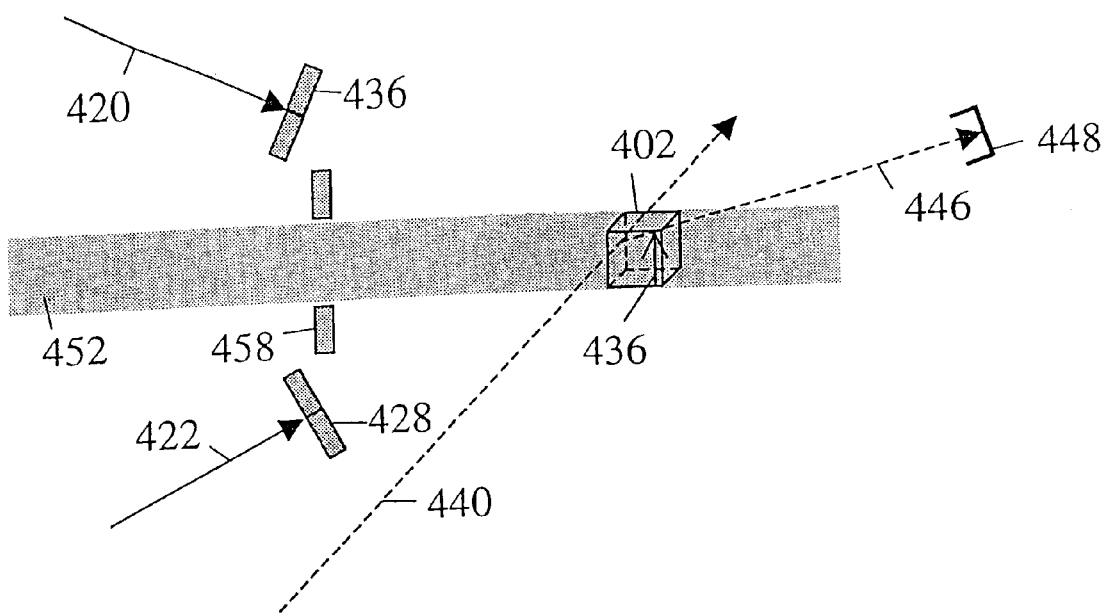
FIG. 14 shows a technique for erasing holograms that were fixed in the storage material with incoherent ultraviolet light.

FIG. 14 depicts system 400 in a configuration that is used to erase a hologram which has been fixed in a storage material 402. The intensity of the incoherent light beam 452 is set relatively high to reduce the exposure time for erasure of information stored in storage material 402. Shutters 428 and 432 are kept closed. Shutter 458 is opened to irradiate storage material 402 with only with the incoherent light beam 452 and simultaneously with illumination by probe beam 440. The intensity of the diffracted beam 446 is monitored with detector 448. As time progresses, the fixed hologram decays causing the intensity of the diffracted beam 446 to decrease to zero or a background count for detector 448. When the diffracted beam 446 vanishes, the fixed hologram is erased.

5. Dependence of Time and Intensity for Erasing Holograms with Incoherent Ultraviolet Radiation on the Diffraction Efficiency of Fixed Holograms and Parameters of the Material A procedure to find the relationship between the diffraction efficiency of a fixed hologram, the intensity of incoherent ultraviolet light, and the time the storage material is irradiated with ultraviolet light for erasing a fixed hologram is detailed below.

A hologram that is capable of being either fixed or erased using fixing radiation, such as incoherent ultraviolet light, depending upon the intensity of light and the duration of exposure, is written to a storage material. The stored image is irradiated with fixing radiation for an optimum exposure including a combination of time and intensity with incoherent ultraviolet light, where the optimum time varies with the particular photorefractive material for purposes of optimizing diffraction efficiency of the stabilized or fixed image. This exposure to fixing radiation, generally, is equal to or larger than a threshold exposure that is required to fix the hologram and less than is required to erase the stored image. For erasure, the intensity of the fixing radiation and the time the material is irradiated depends upon the diffraction efficiency of the fixed hologram and the parameters of the material such as size, thickness, doping, and material sensitivity.

When the characteristics of the storage material are known, the relationship between the diffraction efficiency of the fixed hologram, the time the material is irradiated with incoherent ultraviolet light, and the intensity of incoherent ultraviolet light for erasing a fixed hologram can be determined. These measurements can be obtained for any photorefractive material, according to the process that is outlined below. This process involves measuring the stabilized diffraction efficiency of a material having a stored image that is subjected to different exposures of fixing radiation, in order to develop an empirical correlation between the exposure to fixing radiation and diffraction efficiency of the stored image.

A hologram is fixed in the storage material with incoherent ultraviolet light and its diffraction efficiency is measured. The intensity of incoherent ultraviolet light is set and the storage material 402 is irradiated with the incoherent light beam 452. The intensity of the diffracted beam is monitored until the diffracted beam 446 vanishes. The length of time the material is irradiated with incoherent ultraviolet light is measured from the start of the erasure process until the time the diffracted beam 446 vanishes. The intensity of incoherent ultraviolet light is then varied and the previous procedure is to repeated several times for images having identical diffraction efficiencies with respect to the first stored image. Next, the previous procedure is repeated for holograms that are stored in the storage material with different diffraction efficiencies.

The measured values are fitted to a function that yields the relationship between the time the material is irradiated with incoherent ultraviolet light, the intensity of incoherent ultraviolet light and the diffraction of the fixed hologram. This function yields the minimum time of incoherent ultraviolet irradiation and the minimum intensity of incoherent ultraviolet light required to erase a fixed hologram.

The relationship between the diffraction efficiency of a fixed hologram, the time the material is irradiated with incoherent ultraviolet light, the intensity of incoherent ultraviolet light, and a material parameter can also be determined by following the above procedure. For example, the relationship between the diffraction efficiency of a fixed hologram, the intensity of incoherent ultraviolet light, the time the material is irradiated with incoherent ultraviolet light, and the thickness of the material is determined as follows. The thickness of the storage material is varied and the procedure outlined in the previous paragraph is repeated. The data is then fitted to a function that yields the dependence of the diffraction efficiency of the fixed hologram on the intensity of incoherent ultraviolet light, the time the material is irradiated with incoherent ultraviolet light, and the thickness of the storage material. Similarly, the relationship between the diffraction efficiency of a fixed hologram, the time the material is irradiated with incoherent ultraviolet light, the intensity of incoherent ultraviolet light, and any material parameter can be determined. For example, the relationship between the diffraction efficiency of a fixed hologram, the intensity of incoherent ultraviolet light, the time the material is irradiated with incoherent ultraviolet light, and the thickness of the material is determined. A neural network, adaptive filter, or least squares fit may be used to map the data.

6. Ultraviolet Irradiation Changes Properties of Light Sensitive Materials

When a doped or undoped light sensitive material is irradiated with coherent or incoherent ultraviolet light, its electro-optical properties change. This effect can be used to enhance performance and properties of a material for various optical processing applications. For example, information storage hologram recording and erasure characteristics of a photorefractive material are enhanced when the material is irradiated with coherent or incoherent ultraviolet light before information is ever recorded in it. Thus, after the information is recorded in the photorefractive material, erasure of the recorded information is substantially slower than when the material is never irradiated with ultraviolet light.

Additional Embodiments a) Fixation of an Image Pattern

The system 400 shown in FIG. 4 is set up to fix a plane wave image, i.e. the object beam 420 is linearly polarized, which exists as a circular spot in storage material 402. System 400 can also be used to fix image patterns or bit arrays in the storage material. Using the system shown in FIG. 4, a conventional light modulating device 460, such as a transparency or an electrically or optically addressed spatial light modulator, is positioned in the path of the object beam 420. The light modulating device 460 encodes the object beam 420 with an image pattern or a bit array. Hence, when the object beam 420 and the reference beam 422 interfere within the storage material 402, the light pattern encoded in the object beam 420 is recorded in the storage material 402. The pattern is fixed in the storage material 402 with incoherent ultraviolet light.

b) Fixing Multiple Holograms and Erasing Multiple Fixed Holograms

The process detailed in the present invention is also used to fix multiple holograms or images in a storage material. Multiple holograms are fixed in a storage material one at a time or many at once. Holograms are recorded and fixed in a storage material 402 one at a time according to the principles that are described above. Multiple images, i.e., a group of images, may be fixed at one time, provided they have a residency time in the photorefractive material that permits fixing of the respective images with a diffraction efficiency that is strong enough to be readout. Multiple images are recorded using conventional recording techniques, such as angular, wavelength, or spatial light modulation multiplexing. Second hologram is fixed with incoherent ultraviolet light and so on. This process continues until all the holograms are fixed in the storage material.

When multiple holograms are fixed in a storage material, they can be simultaneously erased with incoherent ultraviolet light as shown in FIG. 14.

The following nonlimiting working example sets forth preferred materials for use in practicing the present invention.

EXAMPLE 1

Fixing an Optical Image in Lithium Niobate

Lithium niobate is very suitable for holographic storage. It contains iron ions, $Fe^{3+}$ and $Fe^{2+}$. Upon light excitation, electrons move from $Fe^{2+}$ (occupied traps) by photovoltaic effect, diffusion, and drift, into the conduction band until they are retrapped by $Fe^{3+}$ (empty traps) elsewhere. Its storage properties are known to improve with y radiation, by doping with one transition metal, and by doping with two transition metals. Properties are known to improve with ultraviolet illumination between 380 nm and 450 nm, but erasure during readout and dark decay persist. Here, results are explained by the theory that shows that irradiation of a lithium niobate crystal with incoherent ultraviolet light between 200 nm and 400 nm after hologram recording creates a field, which compensates the space charge electric field. During readout, the space charge field erases, revealing its replica, which is fixed and is insensitive to uniform illumination and shows no apparent dark decay.

An experimental system was created to mimic the system that is shown in FIG. 4 as system 400. Holograms were stored and fixed in a 1×2×0.2 cm³ 0.015% iron-doped lithium niobate crystal. Light from an argon laser ($\lambda$=514 nm) was split in two plane waves, a reference beam (diameter=6.0 mm, intensity=0.131W/cm²) and an object beam (diameter=6.0 mm, intensity=0.032W/cm²), and made to interfere within the crystal. The polarization of the beams was perpendicular to the optic axis of the crystal. The hologram diffraction efficiency $\eta$, which is the ratio of the intensity of the diffracted beam to that of the incident beam was monitored with a chopped Bragg-matched HeNe laser ($\lambda$=633 nm, diameter=5.0 mm, intensity=0.0028W/cm²). A deuterium lamp, whose spectrum was filtered (200 nm to 400 nm), was used as the incoherent ultraviolet source (diameter=10.0 mm, intensity=0.115W/cm²).

A plane wave hologram was recorded in the crystal to saturation ($\eta$=73.5%). Next, the crystal was irradiated with ultraviolet light for 15 hours and the diffraction efficiency dropped to 50.7%. Then the hologram was read out with the reference beam for 14 hours. The diffraction efficiency dropped to 9.89% after two hours, then reached 7.1% after 7 hours and remained constant afterwards. This shows that unlimited nonvolatile readout cycles is achieved while information quality is preserved, since a continuous readout time of 12 hours already corresponds to many millions readout cycles for commercial storage systems. Further, the fixed hologram registered no apparent dark relaxation after a year at room temperature. This predicts that information can be frozen in the material over years without significant degradation.

Figure 15:
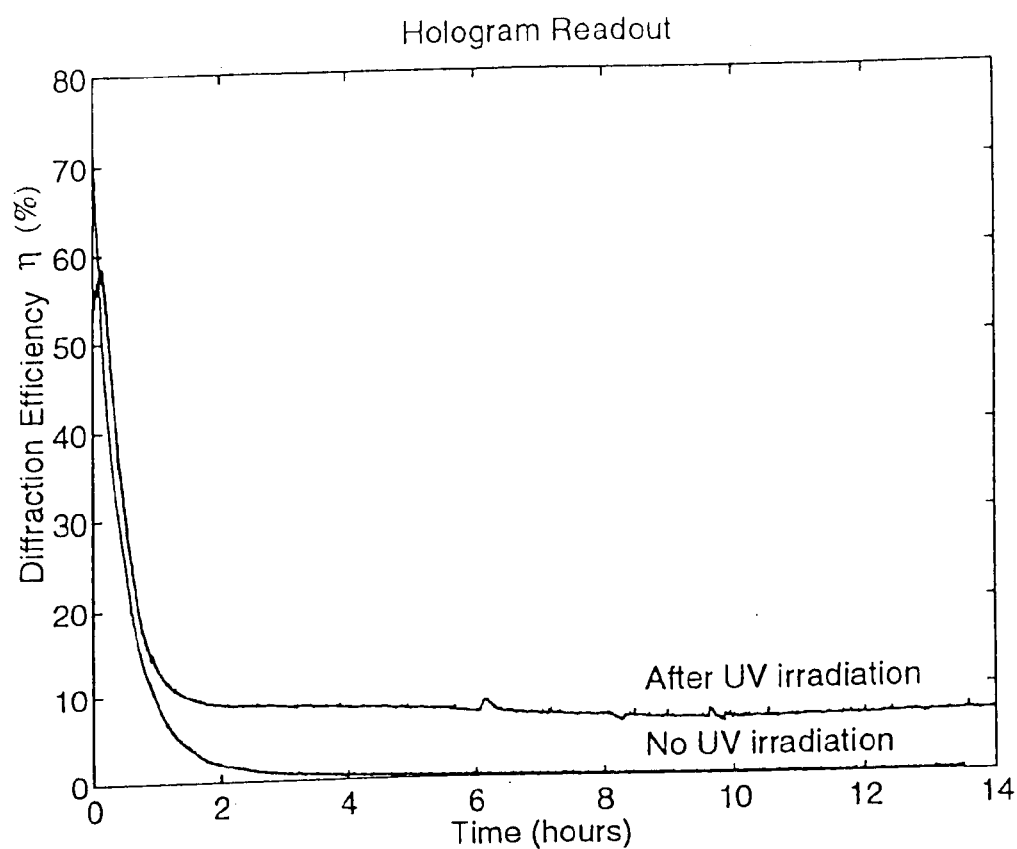
FIG. 15 shows a comparison in diffraction efficiency between a lithium niobate crystal containing an image that has been stabilized by the action of ultraviolet radiation versus that for an image which has that has not been so stabilized.
Figure 16:
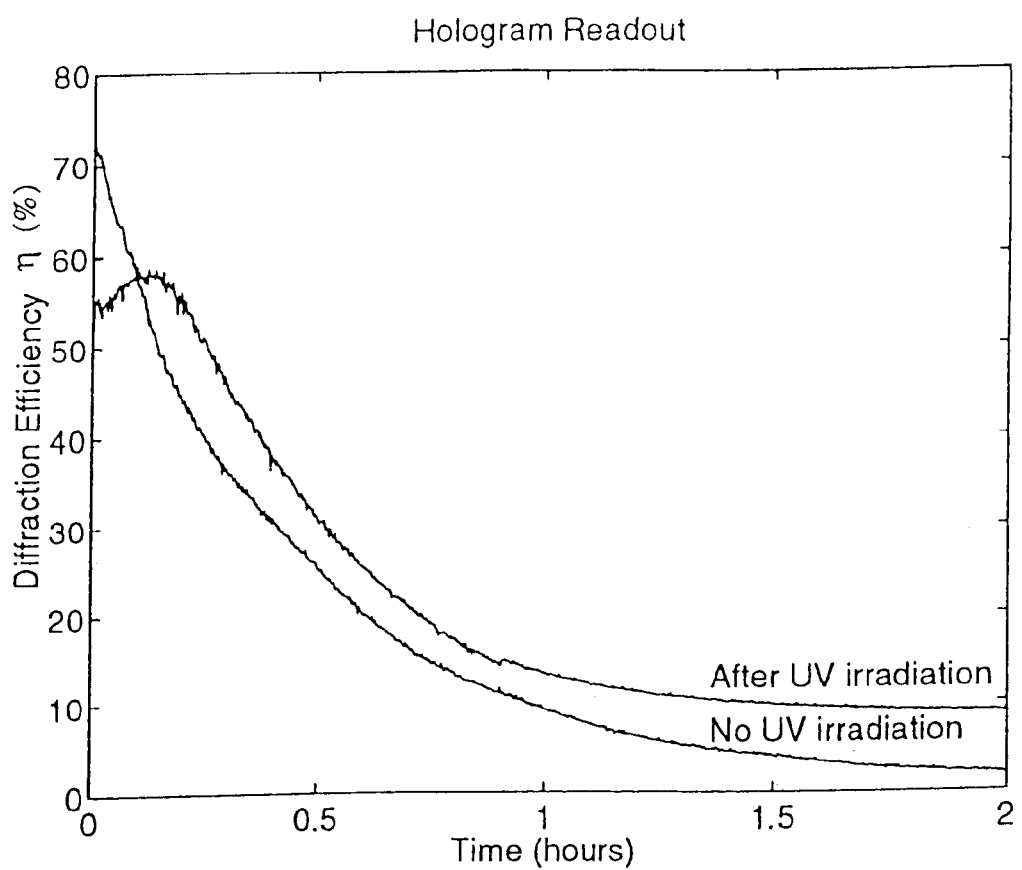
FIG. 16 shows a comparison in diffraction efficiency between a lithium niobate crystal containing an image that has been stabilized by the action of ultraviolet radiation versus that for an image which has that has not been so stabilized.

FIGS. 15 and 16 show the diffraction efficiency of the hologram during erasure when the crystal was irradiated with ultraviolet light (upper curve) and when it was not (lower curve). The fixed hologram was erased with incoherent ultraviolet light thus making this process reversible.

The diffraction efficiency in FIG. 16 (upper curve) increases monotonically to a maximum $\eta$=58.8%, then decreases steadily, until it clamps at 7.1%. This curve does not follow the profile of a decaying exponential, which is characteristic of photorefractive materials with one trap species (lower curve in FIG. 16). Beam enhancement is ruled out since non-Bragg erasure (hologram erased with the reference beam moved from its original position) yielded the same results. Instead, this indicates the presence of a replica hologram, which is insensitive to visible light and formed when different charge carriers were activated during ultraviolet irradiation.

Alternative Embodiments
a) Incoherent Ultraviolet Light

In the process described in the present invention, the ultraviolet light can originate from any incoherent light source that emits light in the ultraviolet spectrum. For instance, the incoherent ultraviolet light source could be an arc lamp such as a mercury lamp or a xenon lamp or a light emitting diode. The intensity of the incoherent ultraviolet light must be above a minimum intensity required to fix a hologram in a storage material and erase it.

In the process detailed in this invention, the incoherent light beam 452 can impinge on any face of the storage material and from any direction.

In the process described in this invention, a single incoherent source 450 radiating ultraviolet light is used to fix a hologram in a storage material and erase it. However, multiple incoherent ultraviolet light sources can be used. For instance, in FIGS. 4–14, multiple incoherent ultraviolet light sources can illuminate one face of a storage material or a plurality faces of a storage material from any direction, or a parabolic mirror can be used to focus ultraviolet light upon storage material 402 from multiple directions. In the process detailed here incoherent ultraviolet irradiation of the material can be done continuously or in time intervals.

b) Coherent Ultraviolet Light

The process described in the present invention uses an incoherent ultraviolet light source 450 for fixing a hologram in a storage material and erasing it. However, a coherent ultraviolet source can also be used to fix holograms in the process disclosed in this invention.

c) Crystal Thickness

The process described in the present invention is not limited to any thickness, area, or shape of a storage material 402. For any given storage material the relationship between the diffraction efficiency of a fixed hologram, the intensity of the incoherent ultraviolet light, the time the material is irradiated with incoherent ultraviolet light, and the thickness of the material can be determined, as described above. Similarly, the relationship between the diffraction efficiency of a fixed hologram, the intensity of incoherent ultraviolet light, the time the material is irradiated with incoherent ultraviolet light, and the thickness of the material can be determined, as described above.

d) Multiple Wavelengths

Broadband UV sources including deuterium lamps and the like are relatively expensive and bulky, whereas diode UV emitters are narrow-band but relatively inexpensive. It follows that multiple emitters may be positioned around the storage material 402, e.g., as in one diode per face of a cube or an array of diodes per face of a cube, and that the combined effects of these emitters could approximate the polychromatic nature of a broadband source or a bandwidth subportion of the broadband source.

e) Crystal Doping

The all-optical and reversible fixing process detailed in the present invention is used to fix information in a material that is either undoped or doped with a single or multiple dopant species. Doping enhances the properties of a photorefractive material by controlling the defects in the material. Likewise doping can be used to enhance the fixing properties of a photorefractive material. For instance, one might dope the material with one or a plurality of dopant species that are sensitive to the wavelength of light used for recording information in a material and one or a plurality of dopant species that are sensitive to ultraviolet radiation, such that a. the diffraction efficiency of fixed holograms in a photorefractive material is increased;

b. the time required for fixing information in a photorefractive material is shortened;

c. the time required for erasing fixed holograms in a photorefractive material is shortened;

d. the intensity of incoherent ultraviolet light required for fixing a hologram in a photorefractive material and erasing it is lowered;

e. the properties of a photorefractive material are enhanced for various optical processing applications;

f. a coherent ultraviolet light source is used the process detailed in this invention.

Conclusion, Ramification, and Scope

Accordingly, the reader will see that the all-optical process for freezing or fixing information in a photorefractive material with incoherent ultraviolet light of this invention is reversible and can be used repeatably and easily to fix information in a photorefractive material and erase it when desired. Repeated read-out and dark storage results in no loss of image quality and no image degradation over time. Further, the method and apparatus of this invention can be used to optimize the properties of a photorefractive material for different optical processing applications. The method and apparatus process described in this invention has the additional advantages in that:

a. it solves the major fundamental problems of information erasure that is a characteristic of photorefractive materials optically;

b. it provides a reversible method for fixing information in a photorefractive material and erasing it, thus allowing full control on information in the material;

c. it prevents information loss;

d. it permits the design of information storage systems where information is written once and read many times;

e. it permits the design of read and write storage systems where information can be stored permanently or erased when desired;

f. it renders the design layout of storage systems simple since a material is irradiated with incoherent ultraviolet light from any side in any direction;

g. it permits the design of compact storage systems since the source of incoherent ultraviolet light can be positioned very close to the storage material;

h. it allows the design of economical storage systems, since incoherent ultraviolet light can originate from any source, whose wavelength spectrum comprises ultraviolet wavelengths such as a light emitting diode or a lamp;

i. it permits the design of fast storage systems since multiple incoherent light sources can be used at once to irradiate a photorefractive material in order to speed up information fixing or erasure of fixed information;

j. it permits the design of flexible storage systems since different materials can be used with the same storage system design;

k. it permits the design of storage systems that can be easily upgradable when a novel photorefractive material emerges;

l. it permits changing properties of a light sensitive material for novel optical processing applications;

m. it permits the use of doping to improve the fixing characteristics of a photorefractive material;

n. it allows the properties of a light sensitive material such as fibers to be enhanced for various applications.

Although the description above contains many specificities, these should not be construed as limiting the scope of the invention but as merely providing illustrations of some of the presently preferred embodiments of this invention. For example, the process works for different light sensitive materials that have various shapes and volumes. It can also be used for various optical processing applications such as optical switching, interconnects, etc. Thus, the scope of the invention should be determined by the appended claims and their legal equivalent, rather than by the example given.

I claim:

1. A method of recording information in a nonlinear optical material, comprising the steps of:

optically inducing a charge distribution pattern in a region of the optical material, the pattern corresponding to the information to be recorded;

producing ultraviolet energy with a diode light source; and directing the ultraviolet energy into region of the optical material in an amount and duration sufficient to induce a fixed replica of the optically induced pattern without thermal fixation; the replica producing a refractive index pattern corresponding to the information to be recorded and wherein the step of optically inducing and directing ultraviolet energy are not overlapping.

2. The method of claim 1 wherein the diode light source is incoherent.

3. The method of claim 1 wherein the diode light source includes a plurality of light emitting diodes.

4. The method of claim 1 wherein the each of the light emitting diodes emits incoherent light.

5. The method of claim 1 wherein the diode light source emits light at a wavelength in the range between 200 and 450 nm.

6. The method of claim 5 wherein the diode light source emits light only at wavelengths in the range between 200 and 450 nm.

7. The method of claim 1 wherein optically inducing a pattern in the optical material corresponding to the information to be recorded includes illuminating the optical material with visible light.

8. The method of claim 1 wherein optically inducing a pattern in the optical material corresponding to the information to be recorded includes inducing a first holographic pattern representing a portion of the information and inducing a second holographic pattern different from the first holographic pattern, the second holographic pattern representing second portion of the information.

9. A method of fixing a refractive index pattern in a nonlinear optical material, comprising the step of inducing a replica of the refractive index pattern by illuminating the nonlinear optical material with light from a plurality of ultraviolet light sources, the light having a cumulative intensity, the cumulative intensity being adequately high to produce the replica, the cumulative intensity further being below a level that would erase the replica and wherein the fixing and recording of the refractive index pattern are not overlapping.

10. The method of claim 9 wherein the plurality of ultraviolet light sources includes a first LED in a first location and oriented to emit ultraviolet light toward the nonlinear optical material along a first vector and a second LED in a second location different from the first location and oriented to emit ultraviolet light toward the nonlinear optical material along a second vector, such that the nonlinear optical material receives ultraviolet light from a plurality of different directions.

11. The method of claim 9 wherein the plurality of ultraviolet light sources includes an array of ultraviolet LEDs.

12. The method of claim 9 wherein the plurality of ultraviolet light sources emits light at a wavelength in the range between 200 and 450 nm.

13. The method of claim 12 wherein the plurality of ultraviolet light sources emits light only at wavelengths in the range between 200 and 450 nm.

* * * * *